US007696528B2

(12) United States Patent
Kellner-Werdehausen et al.

(10) Patent No.: US 7,696,528 B2
(45) Date of Patent: Apr. 13, 2010

(54) THYRISTOR WHICH CAN BE TRIGGERED ELECTRICALLY AND BY RADIATION

(75) Inventors: Uwe Kellner-Werdehausen, Leutenbach (DE); Franz-Josef Niedernostheide, Münster (DE); Hans-Joachim Schulze, Ottobrunn (DE); Jörg Dorn, Buttenheim (DE)

(73) Assignee: Infineon Technologies AG, Munich (DE)

( * ) Notice: Subject to any disclaimer, the term of this patent is extended or adjusted under 35 U.S.C. 154(b) by 273 days.

(21) Appl. No.: 11/561,985

(22) Filed: Nov. 21, 2006

(65) Prior Publication Data

US 2007/0131963 A1 Jun. 14, 2007

Related U.S. Application Data

(63) Continuation of application No. PCT/EP2005/005049, filed on May 10, 2005.

(30) Foreign Application Priority Data

May 21, 2004 (DE) ........................ 10 2004 025 082

(51) Int. Cl.
*H01L 29/74* (2006.01)
(52) U.S. Cl. ...................... 257/107; 257/109
(58) Field of Classification Search ................ 257/107, 257/109, 113, E31.071
See application file for complete search history.

(56) References Cited

U.S. PATENT DOCUMENTS

| 3,445,687 | A | 5/1969 | Weinstein |
| 3,683,306 | A | 8/1972 | Bulthuis et al. |
| 4,243,998 | A | 1/1981 | Schlangenotto et al. |
| 4,261,001 | A | 4/1981 | Temple |
| 5,182,626 | A | 1/1993 | Akiyama et al. |
| 5,208,576 | A | 5/1993 | Wunderlich et al. |
| 5,448,103 | A | 9/1995 | de Wit |

(Continued)

FOREIGN PATENT DOCUMENTS

DE 19640311 A1 4/1998

(Continued)

OTHER PUBLICATIONS

Duclos, R. A. et al. "Thyristors with Polysilicon Shunt Resistors." Technical Notes—A Publication of RCA, Princeton, NJ, US, TN No. 1365, Mar. 21, 1985.

*Primary Examiner*—Lynne A Gurley
*Assistant Examiner*—Vernon P Webb
(74) *Attorney, Agent, or Firm*—Coats & Bennett, P.L.L.C.

(57) ABSTRACT

A thyristor has a radiation-sensitive breakdown structure (20), a gate electrode (92) that is placed at a distance from the latter in a lateral direction and an ignition stage structure having at least one ignition stage (51, 91) equipped with an n-doped auxiliary emitter (51), which forms a pn-junction (55) together with the p-doped base (6), the thyristor being both electrically and radiation-ignited. In a method for contacting a thyristor that can be ignited by radiation with a gate electrode (92), a contact ram (200) that is adapted to the geometry of the gate electrode (92) is pressed against the thyristor. In a method for monitoring the ignition of a thyristor that is ignited by incident radiation, the electric voltage that is applied to the gate electrode (92) or the electrically conductive electrode (105, 201) is monitored.

22 Claims, 3 Drawing Sheets

U.S. PATENT DOCUMENTS

| | | | |
|---|---|---|---|
| 5,637,886 A * | 6/1997 | Satoh et al. | 257/107 |
| 6,043,516 A | 3/2000 | Schulze | |
| 6,646,539 B2 | 11/2003 | Bloch | |
| 6,723,586 B1 * | 4/2004 | Niedernostheide et al. | 438/133 |
| 2002/0022306 A1 * | 2/2002 | Schulze et al. | 438/133 |
| 2003/0232205 A1 | 12/2003 | Tsukaguchi et al. | |
| 2004/0031545 A1 | 2/2004 | Okamoto et al. | |
| 2006/0267104 A1 * | 11/2006 | Scholz et al. | 257/379 |

FOREIGN PATENT DOCUMENTS

| | | |
|---|---|---|
| DE | 19947036 C1 | 5/2001 |
| DE | 10053957 A1 | 5/2002 |

* cited by examiner

THYRISTOR WHICH CAN BE TRIGGERED ELECTRICALLY AND BY RADIATION

CROSS-REFERENCE TO RELATED APPLICATION

This application is a continuation of co-pending International Application No. PCT/EP2005/005049 filed May 10, 2005, which designates the United States, and claims priority to German application number DE 10 2004 025 082.0 filed May 21, 2004.

TECHNICAL FIELD

The invention relates to a thyristor which can be triggered both electrically and by radiation.

BACKGROUND

A thyristor such as this is known, for example, from DE 37 06 255 C2. The thyristor described in this document can be triggered by light and, furthermore, has a gate contact for electrical triggering.

SUMMARY

In an embodiment, a thyristor comprises a semiconductor body in which a p-doped emitter, an n-doped base, a p-doped base and an n-doped emitter are arranged successively, a radiation-sensitive breakdown structure and a gate electrode which is at a distance from it in the lateral direction, and a trigger stage structure, which has at least one trigger stage with an n-doped auxiliary emitter, which forms a pn junction with the p-doped base.

In one embodiment, a method for contacting a thyristor which has a radiation-sensitive breakdown structure and a gate electrode which is at a distance from it in the lateral direction, has the steps: providing a contact stamp which has an electrically conductive element whose geometry is matched to the geometry of the gate electrode, and pressing of the contact stamp onto the thyristor in such a manner that the electrically conductive element makes contact with the gate electrode.

In one embodiment, a method for monitoring the triggering process of a thyristor having a semiconductor body in which a p-doped emitter, an n-doped base, a p-doped base and an n-doped emitter are arranged successively, a radiation-sensitive breakdown structure and a gate electrode which is at a distance from it in the lateral direction, and a trigger stage structure, which has at least one trigger stage with an n-doped auxiliary emitter, which forms a pn junction with the p-doped base, has the following steps: triggering of the thyristor by radiation which is incident on the radiation-sensitive breakdown structure, and monitoring of the electrical voltage which is applied to the gate electrode and/or to the electrically conductive electrode.

BRIEF DESCRIPTION OF THE DRAWINGS

The present invention will be explained in more detail in the following text with reference to the attached figures, in which.

DETAILED DESCRIPTION

Figure 1:
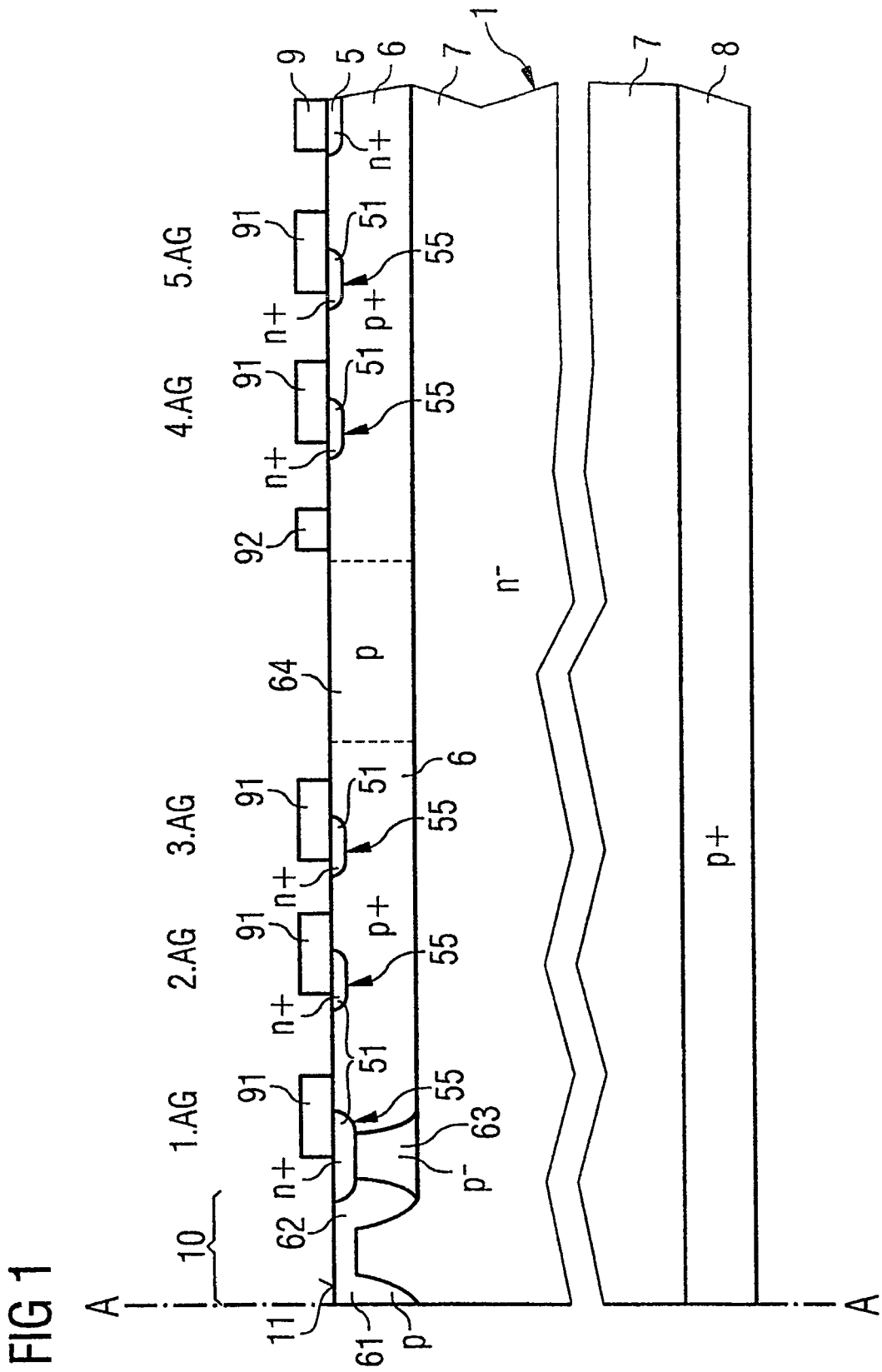
FIG. 1 shows a side cross-sectional view of a detail of a thyristor.

The thyristor according to an embodiment has a semiconductor structure with a semiconductor body in which a p-doped emitter, an n-doped base, a p-doped base and an n-doped emitter are arranged successively in the vertical direction of the semiconductor body. Furthermore, the semiconductor structure has a radiation-sensitive breakdown structure, a gate electrode which is arranged at a distance from the breakdown structure in the lateral direction of the semiconductor body, and a trigger stage structure, which has at least one trigger stage with an n-doped auxiliary emitter, which forms a pn junction with the p-doped base.

In an embodiment, the n-doped auxiliary emitter of a trigger stage is embedded in the p base and may preferably extend as far as the front face of the semiconductor body, that is to say as far as the side of the semiconductor body facing away from the p-doped emitter.

In an embodiment, the object of the trigger stage is to amplify a current flowing via the pn junction between the p base and the auxiliary emitter and to pass it on within the p-doped base in the direction of a next trigger stage. The direction of this current which preferably may flow in the lateral direction in the p-doped base is also referred to as the trigger current direction. The trigger current direction depends on the physical form of the thyristor. In the case of a rotationally symmetrical thyristor, the trigger current runs in the radial direction.

According to an embodiment, when a plurality of trigger stages are present, at least one of the trigger stages has an electrode which is arranged on the front face and makes contact not only with the n-doped auxiliary emitter but also with the p-doped base. This electrode may be preferably formed from metal, for example aluminum. The electrode can likewise also be formed from heavily n-doped polysilicon.

The thyristor according to an embodiment can be triggered both electrically, by application of a voltage to the gate electrode, and by means of radiation which is incident on the radiation-sensitive breakdown structure.

If the thyristor is triggered by incident radiation, then a trigger current is created in the area of the radiation-sensitive breakdown structure which propagates in the p-doped base in the trigger current direction in the direction of the n-doped emitter, and is amplified by means of the trigger stage structure. The triggering process for the thyristor is completed when the amplified trigger current reaches the n-doped main emitter.

According to an embodiment, the radiation-sensitive breakdown structure is in the form of a BOD structure (BOD=Break Over Diode), that is to say a breakdown diode.

The trigger stage structure advantageously may comprise a plurality of trigger stages, in order to amplify the trigger current from one trigger stage to the next. These trigger stages in the trigger stage structure are matched to one another and are matched to the breakdown structure in such a manner that the triggering progresses in a controlled manner, starting from the radiation-sensitive breakdown structure, as far as the n-doped main emitter.

In order to also allow the thyristor according to an embodiment to be triggered electrically, the gate electrode is provided and is arranged on the front face of the semiconductor body, and the thyristor can be triggered by application of an external electrical voltage to this gate electrode. When an electrical trigger pulse is applied, a trigger current propagates in the direction of the n-main emitter, starting from the area of the gate electrode.

The gate electrode can be preferably arranged in the lateral direction between the radiation-sensitive breakdown structure and the n-doped emitter.

According to an embodiment, the trigger stage structure comprises at least one inner trigger stage and at least one outer trigger stage, with the at least one inner trigger stage being arranged in the lateral direction between the radiation-sensitive breakdown structure and the gate electrode, and with the at least one outer trigger stage being arranged in the lateral direction between the gate electrode and the n-doped emitter. A trigger current which is produced at the radiation-sensitive breakdown structure first of all passes in the trigger current direction in an arrangement such as this through the inner trigger stage, then through the gate electrode and then through the outer trigger stage before reaching the n-main emitter. The trigger current is in this case amplified from one trigger stage to the next.

In order to monitor the triggering process, the electrical voltage can be detected in the p base via the gate electrode, which is arranged between the radiation-sensitive breakdown structure and the n-doped main emitter. In the case of light triggering, when the trigger current which propagates in the p-doped base from the radiation-sensitive breakdown structure in the direction of the n-doped emitter reaches the gate electrode, then the electrical voltage which is applied there changes, and its monitoring allows monitoring of the triggering process. The information obtained in this way can be used, for example, to switch off the thyristor, or to influence it in some other way, or else to drive an external circuit.

In order to limit the trigger current which propagates in the p-doped base, particularly when incident radiation is used for triggering, the different embodiments provide for the resistivity to be increased in one section of the p-doped base. In this case, the gate electrode can be arranged in the lateral direction, preferably between this section and the n-doped emitter. If the thyristor in this arrangement is triggered by application of an electrical voltage to the gate electrode, then this section of the p base with an increased electrical resistance does not limit the trigger current.

Alternatively, the gate electrode can be arranged in the lateral direction both between the radiation-sensitive breakdown structure and the section of the p-doped base with an increased electrical resistance, and within the section of the p-doped base with an increased electrical resistance.

Furthermore, the embodiments provide for a plurality of such sections with an increased electrical resistance to be arranged in the p-doped base, in which case each individual one of these sections can be arranged in the same way as the section described above. In order in particular to achieve an optimum triggering behavior in this case, different sections such as these may have the same or different absolute resistance values or resistivity values.

In order to provide protection against electrical flashovers in particular in the area of the inner trigger stages and/or the areas of the p base with an increased resistance, it is advantageous to provide the front face of the thyristor, if appropriate including the electrodes arranged on it, with a protective lacquer in sections. The protective lacquer should have as high a dielectric constant as possible. The thickness of the protective lacquer layer may be up to several hundred micrometers.

According to an embodiment, the area which is provided with the protective lacquer is located between the radiation-sensitive breakdown structure and the gate electrode. In order to avoid adversely affecting any electrical pressure contact with the gate electrode, for example by means of a contact stamp, it is advantageous for the thickness of the protective lacquer layer to be less than the vertical size of the gate electrode.

By way of example, the thyristor has a central area in which the radiation-sensitive breakdown structure and at least one trigger stage of the trigger structure are arranged, and may in particular be rotationally symmetrical. In this case, it can be advantageous for the gate electrode and/or at least one auxiliary emitter likewise to be rotationally symmetrical, at least in sections, and preferably to be annular. The central area in this embodiment is located in the area of the axis of symmetry.

A contact stamp is provided in order to make electrical contact with the gate electrode of a thyristor according to an embodiment, and is pressed onto the gate electrode.

The contact stamp optionally has contouring, such as a projection, a tab, a step, a slot, a groove or the like, in order to prevent the gate electrode from sliding or sliding off in the lateral direction of the semiconductor body. This contouring is designed such that it interacts with the gate electrode and/or with contouring which is complementary to it and is arranged on the semiconductor body.

Alternatively or additionally, the contact stamp can also be held in its integral position, in which contact is made with the gate electrode, by means of a housing of the thyristor.

In order that any protective lacquer layer which may be applied to an area of the front face of the semiconductor body is not damaged by the contact stamp, the distance between the contact stamp, which is pressed onto the gate electrode, and the front face must be greater than or equal to the thickness of the protective lacquer layer in this area.

In order to allow the thyristor according to an embodiment to be triggered both electrically and by incident radiation, it is advantageous for the contact stamp to have a radiation channel in order to pass incident radiation into the area of the radiation-sensitive breakdown structure.

The radiation channel may optionally be provided with a window, a lens, a prism, a filter or some other optical element through which radiation can pass and through which radiation which is required for triggering of the thyristor can pass, and through which the incident radiation is passed to the radiation-sensitive breakdown structure.

If, for certain applications, it is not desirable or is not necessary for the thyristor to be triggered by radiation, it is also possible to use a contact stamp which has no radiation channel, or whose radiation channel is provided with an element which blocks incident radiation. In this case, the thyristor can be triggered only by means of an electrical voltage via the contact stamp.

In a corresponding but converse manner, it is also possible to use a contact stamp which has a light channel, but which is electrically isolated from the gate electrode. A contact stamp such as this preferably may have two mutually complementary contoured areas, one of which is arranged on the thyristor and the other of which is arranged on the contact stamp, and which are used to fix the contact stamp with respect to the thyristor.

According to an embodiment, the thyristor can be triggered at the same time or with a time offset optically by incident radiation and electrically by means of an electrical trigger pulse.

The thyristor according to an embodiment thus provides a universal thyristor which can be matched in a simple manner to the respective requirements without having to modify the thyristor itself.

A thyristor according to an embodiment can optionally also have one or more integrated protective functions in any desired combinations.

One such protective function is represented by a BOD structure, as already mentioned. This protects the thyristor against overvoltage and can be set such that the thyristor triggers reliably at the location of this BOD structure when a voltage which is applied in the forward direction exceeds a specific threshold value.

By way of example, an externally formed and non-integrated overvoltage protective function for a thyristor which can be triggered electrically is known from L. O. Eriksson et al., Conc. Record of the 1990 IEEE Industrial Applications Society Annual Meeting, Volume 2, pages 1648-1657.

Further protective functions are, for example, a dU/dt protective function or a tq protective function. The dU/dt protective function ensures that the thyristor triggers correctly even when a voltage which is applied in the forward direction to the thyristor rises very quickly. A dU/dt protective function such as this is explained in more detail, by way of example, on pages 267-270 of the publication H.-J. Schulze et al.: ISPSD 2000, Toulouse.

A tq protective function, as is described by way of example in DE 199 47 028 A1, protects a thyristor against dynamic voltage transients which occur within the recovery time (recovery time protection).

In the case of a thyristor according to an embodiment which can in principle be triggered both by a light pulse and by a current pulse, a suitable apparatus such as a corresponding contact stamp makes it possible to ensure that the thyristor can be triggered only by light, only by an electrical trigger pulse, or else by light and by an electrical trigger pulse.

Furthermore, any desired protective functions, in particular the abovementioned functions of overvoltage protection, dU/dt protection and recovery time protection, can be combined with one another in a thyristor such as this, and in principle it is even possible not to provide any protective function.

The thyristor, only a detail of which is illustrated in FIG. 1, is symmetrical with respect to the axis A-A which is shown by dashed lines and passes through the center point of the component. The component may be preferably rotationally symmetrical with respect to this axis A-A and thus has a circular shape in plan view, which is not shown in any more detail.

The thyristor has a semiconductor body 1 with a front face 11 and a rear face, facing away from the front face. A p-doped emitter 8, an n-doped base 7 which is adjacent to the p-doped emitter, a p-doped base 6 which is adjacent to the n-doped base, and an n-doped emitter 5 which is embedded in the p-doped base 6 are arranged successively in a vertical direction in the semiconductor body. The p-doped emitter 8 and the n-doped base 7 are also referred to as the anode-side emitter and the anode-side base, and the p-doped base 6 and the n-doped emitter 5 are also referred to in a corresponding manner as the cathode-side base and the cathode-side emitter.

The breakdown structure 10 in the form of a BOD structure is provided in the central area of the component and is formed in such a way that the n-doped base 7 extends further in this area than in the other areas as far as the front face 11 of the semiconductor body, with curved sections 61, 62 of the p base 6 being formed adjacent to this area. When a voltage is applied in the forward direction, in which the pn junction between the n base and p base is reverse-biased, the field strength in the area of the curved sections 61, 62 is higher than the field strength in the other areas of the component, thus fixing the location of the first voltage breakdown in the component to be in the area of this BOD structure.

A relatively lightly p-doped zone 63 may be preferably provided between the curved sections 61, 62 of the p base 6 and the sections of the p base 6 adjacent to them.

The BOD breakdown structure 10 defines the withstand voltage of the component in the forward direction, with the thyristor being triggered when an avalanche breakdown occurs in the area of the breakdown structure 10.

This triggering can be initiated by application of a high forward voltage or, with a forward voltage applied, by incident radiation as well, which strikes the front face in the area of the breakdown structure 10. The incident radiation can be preferably light at a wavelength in the range between about 800 nanometers and 1000 nanometers.

The n-doped emitter 5 forms the main emitter of the component, which makes contact with a main electrode 9. One or more auxiliary emitters 51 is or are provided in addition to this main emitter. FIG. 1 shows a plurality of such auxiliary emitters 51, which are arranged at a distance from one another in the lateral direction between the central area with the BOD structure 10 and the n-doped main emitter 5. Each of these auxiliary emitters 51 makes contact with an electrode 91, which short-circuits the auxiliary emitter and the surrounding p-doped base 6. One of the auxiliary emitters 51 and an electrode 91 which makes contact with the auxiliary emitter 51 in each case form one trigger stage of a trigger stage structure, which is also referred to as an amplifying gate structure (AG structure). This trigger stage structure ensures amplification of the trigger current which occurs in the event of an avalanche breakdown, and results in rapid and uniform propagation of the trigger current in the p base 6, and thus in rapid and uniform triggering propagation in the component. The individual trigger stages 51, 91 (1st AG to 5th AG) trigger successively from the inside outwards in the radial direction of the component when an avalanche breakdown occurs.

In order to limit the current which flows radially outwards in the direction of the main emitter in the base during a triggering process, the p base 6 preferably may have a relatively lightly doped section 64 between two of the AG structures. In the illustrated example, this is the section 64 of the p base, which is located between the third AG structure (3rd AG), and the fourth AG structure (4th AG), originating from the central area.

The withstand voltage of the component in the forward direction is governed by the geometry of the p base and of the n base in the area of the BOD structure 10, and by the doping concentration in the area of the p base 6 and of the n base 7 in the area of the BOD structure.

A gate electrode 92 is arranged on the front face 11 of the semiconductor body 1, via which the thyristor can be triggered electrically by application of an external trigger voltage.

Figure 2:
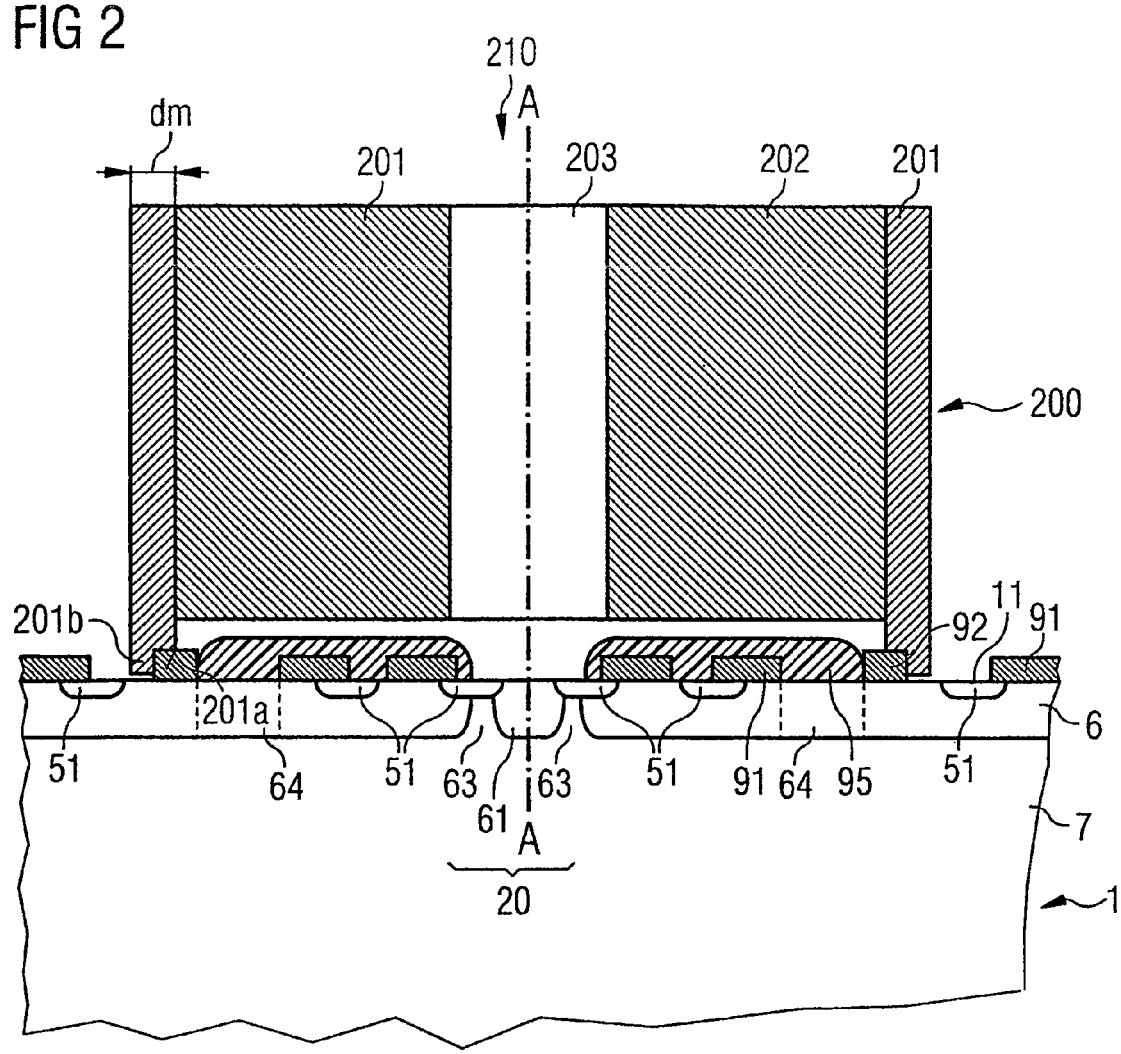
FIG. 2 shows a cross section through a contact stamp with a radiation channel.

When a trigger voltage is applied and/or a radiation pulse is supplied a contact stamp 200 may be preferably provided, with reference to FIG. 2, whose dimensions are matched to the thyristor. FIG. 2 shows the central area of the thyristor 1 with the contact stamp 200 applied to it, in the form of a cross-sectional side view. A protective lacquer layer 95 is applied to the front face 11 of the thyristor in an area which is located within the annular gate electrode 92, in particular for protection against electrical flashovers, and its thickness may be up to a few hundred micrometers. The protective lacquer layer covers the front face 11 of the semiconductor body 1 and the electrodes 91 (which are arranged in this area) of the trigger stages, with the exclusion of the area above the radiation-sensitive breakdown structure 20. The protective lacquer layer may also be designed to allow optical radiation to pass through it. In this case, the protective lacquer layer preferably also may cover the area of the front face 11 above the radiation-sensitive breakdown structure 20.

The contact stamp 200 is pressed by an external force onto the front face 11 of the thyristor, so that a contact surface 201a of the contact stamp 200 makes an electrically conductive contact with the gate electrode.

The contact stamp 200 is rotationally symmetrical and has an electrically conductive element 201, whose geometry is matched to the geometry of the gate electrode 92 and which has a contact surface 201a which makes contact with the gate electrode 92. The electrically conductive element 201 is in the form of a sleeve with a circular cross section, and its preferred thickness dm is between 0.1 mm and 1 mm.

In the area of its contact surface 201a, the electrically conductive element 201 has a step 201b in order to prevent the contact stamp 200 from sliding or sliding off the gate electrode 92 in the lateral direction. Instead of a step, a projection, a tab, a slot, a groove or a similar apparatus can also be provided, which is designed such that it interacts with an apparatus which is complementary to it and can be arranged on the semiconductor body 1, or preferably with the gate electrode, and thus fixes the contact stamp 200 in its intended position.

The cross section of the electrically conductive element 201 may also be square, rectangular or may be formed in some other way, even asymmetrically. The important factor is that the electrically conductive element 201 can make sufficiently good contact with the gate electrode 92 of the thyristor.

An inner body 202 which is connected to the electrically conductive element 201 is arranged in it. The inner body 202 may be in the form of an electrical conductor or an insulator, in sections or completely. The inner body 202 in particular contributes to the mechanical robustness of the contact stamp 200 although it is not absolutely essential, in particular if the electrically conductive element 201 is sufficiently robust in its own right. The electrically conductive element 201 and the inner body 202 can optionally be formed integrally. On its side facing the semiconductor body 1, the inner body 202 is sufficiently far away from the protective lacquer layer 95 that the latter is not damaged by the inner body 202.

The contact stamp 200 has a radiation channel 210 through which radiation of any desired type, preferably light including infrared, visible and ultraviolet light, can pass. An optical element 203 through which radiation can pass and which is composed, for example, of plastic is arranged in the radiation channel 210 and is designed such that radiation incident from above strikes the radiation-sensitive breakdown structure 20. The diameter of the radiation channel 210 is in this case matched to the diameter of the radiation-sensitive breakdown structure 20.

Depending on the respective intended use, contact stamp 200 may be designed in widely differing ways, as will be explained in the following text with reference to FIGS. 3 to 7, which illustrate various contact stamps in the form of a cross-sectional side view.

Figure 3:
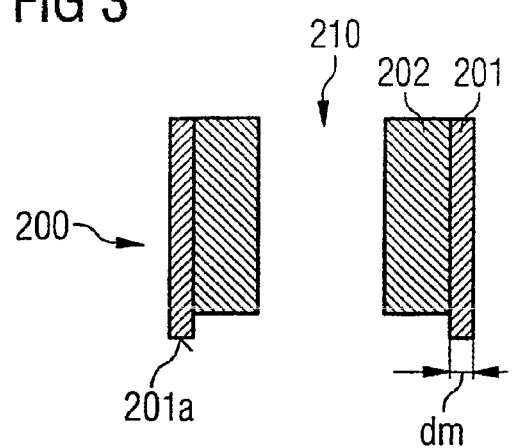
FIG. 3 shows a cross section through a contact stamp as shown in FIG. 2, with an element which is arranged in the radiation channel and through which radiation can pass.

FIG. 3 shows a contact stamp which corresponds essentially to the contact stamp shown in FIG. 2, but in which there is no optical element in the radiation channel. The contact stamp is rotationally symmetrical and has an electrically conductive element 201 with a contact surface 201a which is arranged on its contact face and is intended to make contact with the gate electrode of a thyristor according to an embodiment. The electrically conductive element 201 is in the form of a sleeve with a circular cross section, and its preferred thickness dm is between 0.1 mm and 1 mm.

The cross section of the electrically conductive in some other way, even asymmetrically. The important factor is element 201 may also be square, rectangular or may be formed that the electrically conductive element 201 can make sufficiently good contact with the gate electrode 92 of the thyristor.

An inner body 202 which is connected to the electrically conductive element 201 is arranged in it. The inner body 202 may be in the form of an electrical conductor or an insulator, in sections or completely. The inner body 202 in particular contributes to the mechanical robustness of the contact stamp 200 although it is not absolutely essential, in particular if the electrically conductive element 201 is sufficiently robust in its own right. The electrically conductive element 201 and the inner body 202 can optionally be formed integrally.

Figure 4:
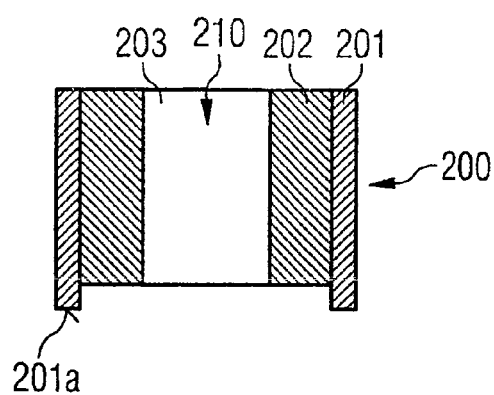
FIG. 4 shows a cross section through a contact stamp with an inner body in the form of an element through which radiation can pass.

The contact stamp illustrated in FIG. 4 corresponds to that illustrated in FIG. 2, but without any step on the contact face of the electrically conductive element 201.

Figure 5:
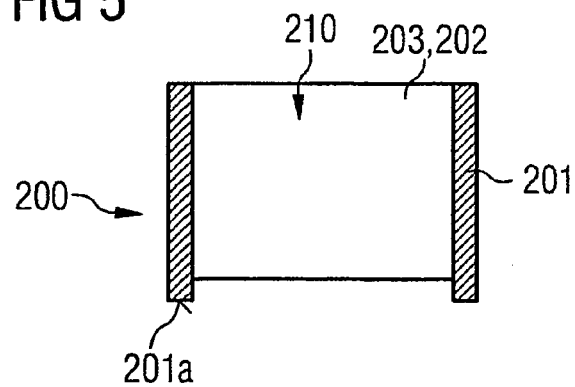
FIG. 5 shows a cross section through a contact stamp as shown in FIG. 4, but with an inner body through which radiation cannot pass.

With reference to FIG. 5, the inner body 202 may be in the form of an optical element 203 through which radiation can pass.

If, in certain applications it is not desirable or is not necessary to trigger a thyristor according to an embodiment by radiation, it is also possible to use a contact stamp 200 whose radiation channel is provided with an element which blocks incident radiation, or which has no radiation channel at all.

Figure 6:
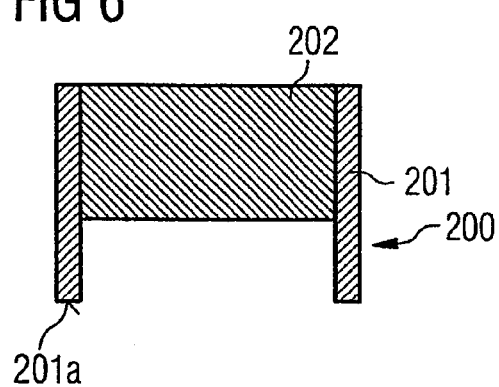
FIG. 6 shows a cross section through a contact stamp with an inner body which has insulation.

FIG. 6 shows a cross section through a contact stamp 200 such as this. The inner body 202 has no radiation channel and is composed of a material through which the radiation which would be suitable for triggering of the thyristor cannot pass.

Figure 7:
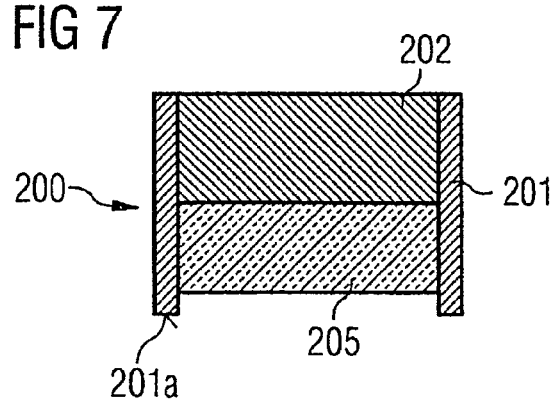
FIG. 7 shows a cross section through a component arrangement with a thyristor according to an embodiment and with a contact stamp.

Furthermore, with reference to FIG. 7, it is optionally possible to provide the contact stamp 200 with insulation 205 in the area of the inner element 202 on its contact face. The insulation 205 may either allow radiation to pass through it, or may block radiation. By way of example, plastic or quartz glass are suitable as materials for this purpose. Insulation through which radiation can pass can be used in conjunction with a radiation channel to also achieve high dielectric strength in the contact-making area of the contact stamp.

LIST OF REFERENCE SYMBOLS

1 Semiconductor body
5 n-doped emitter
6 p-doped base
7 n-doped base
8 p-doped emitter
9 Main electrode
11 Front face of the semiconductor body
20 Radiation-sensitive breakdown structure
51 Auxiliary emitter
55 pn junction
61 First area of the p base
62 Second area of the p base 63 Section of the p base
64 Section of the p base
91 Electrode which makes contact with the auxiliary emitter
92 Gate electrode
95 Protective lacquer
100 Mask
102 Mask opening
105 Control electrode
200 Contact stamp
201 Electrically conductive element
201a Contact surface
201b Step
202 Inner body
203 Optical element through which radiation can pass
205 Insulation
210 Radiation channel

What is claimed is:

1. A thyristor comprising:
a semiconductor body in which a p-doped emitter, an n-doped base, a p-doped base and an n-doped emitter are arranged successively,
a radiation-sensitive breakdown structure and a gate electrode which is at a distance from it in the lateral direction,
a contact stamp which has an electrically conductive element which makes contact with the gate electrode, and
a trigger stage structure, which has at least one trigger stage with an n-doped auxiliary emitter, which forms a pn junction with the p-doped base.

2. The thyristor according to claim 1, wherein the radiation-sensitive breakdown structure is in the form of a breakover diode.

3. The thyristor according to claim 1, having at least one electrode which is arranged on the front face of the semiconductor body and makes contact with the n-doped auxiliary emitter of the at least one trigger stage, and with the p-doped base.

4. The thyristor according to claim 1, wherein the trigger stage structure is arranged in the lateral direction between the radiation-sensitive breakdown structure and the n-doped emitter.

5. The thyristor according to claim 1, wherein at least one trigger stage is arranged in the lateral direction between the radiation-sensitive breakdown structure and the gate electrode.

6. The thyristor according to claim 1, wherein at least one trigger stage is arranged in the lateral direction between the gate electrode and the n-doped emitter.

7. The thyristor according to claim 1, having a central area in which the radiation-sensitive breakdown structure and/or the gate electrode are/is arranged.

8. The thyristor according to claim 1, wherein the resistivity of the p-doped base is increased in one section.

9. The thyristor according to claim 8, wherein the gate electrode is arranged in the lateral direction between the section with the increased resistivity and the n-doped emitter.

10. The thyristor according to claim 1, wherein the front face of the semiconductor body, if appropriate including electrodes which are arranged on it, is coated at least in sections with a protective lacquer.

11. The thyristor according to claim 1, wherein the gate electrode is annular.

12. The thyristor according to claim 1, wherein the electrically conductive element has a thickness of between 0.1 mm and 1 mm.

13. The thyristor according to claim 1, wherein the electrically conductive element is formed from metal, at least in sections.

14. The thyristor according to claim 1, wherein the contact stamp has an inner body which is surrounded by the electrically conductive element, at least in sections.

15. The thyristor according to claim 14, wherein the inner body is formed from metal or plastic, at least in sections.

16. The thyristor according to claim 14, wherein the inner body is in the form of an insulator on the side facing the semiconductor body.

17. The thyristor according to claim 1, wherein the contact stamp has a radiation channel.

18. The thyristor according to claim 17, wherein the radiation channel is arranged in the inner body, at least in sections.

19. The thyristor according to claim 1, wherein the electrically conductive element is essentially rotationally symmetrical.

20. The thyristor according to claim 1, wherein the electrically conductive element has an apparatus which fixes the contact stamp, which makes contact with the semiconductor body, in the lateral direction with respect to the semiconductor body.

21. The thyristor according to claim 20, wherein the apparatus is in the form of a projection, tab, step, slot or groove.

22. The thyristor according to claim 1, which has at least one of the following protective functions: overvoltage protection, dU/dt protection and recovery time protection.

* * * * *